(12) United States Patent
Doyle et al.

(10) Patent No.: US 11,493,565 B2
(45) Date of Patent: Nov. 8, 2022

(54) LEAKAGE CHARACTERIZATION AND MANAGEMENT FOR ELECTRONIC CIRCUIT ENHANCEMENT

(71) Applicant: International Business Machines Corporation, Armonk, NY (US)

(72) Inventors: Matthew Doyle, Chatfield, MN (US); James Busby, New Paltz, NY (US); Edward N. Cohen, Kingston, NY (US); John R. Dangler, Rochester, MN (US); Michael Fisher, Poughquag, NY (US); Arthur Higby, Cottekill, NY (US); David Clifford Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 16/702,160

(22) Filed: Dec. 3, 2019

(65) Prior Publication Data

US 2021/0165052 A1    Jun. 3, 2021

(51) Int. Cl.
| | |
|---|---|
| G01R 31/54 | (2020.01) |
| H05K 1/02 | (2006.01) |
| H05K 1/18 | (2006.01) |
| H05K 3/00 | (2006.01) |

(52) U.S. Cl.
CPC ........... G01R 31/54 (2020.01); H05K 1/0275 (2013.01); H05K 1/189 (2013.01); H05K 3/0005 (2013.01)

(58) Field of Classification Search
CPC ...... G01R 31/54; H05K 1/0275; H05K 1/189; H05K 3/0005; H05K 1/118; H01L 23/57; G06F 21/86; G06F 21/87; G06F 2221/2143; G06K 19/07381
See application file for complete search history.

(56) References Cited

U.S. PATENT DOCUMENTS

| | | | | |
|---|---|---|---|---|
| 4,593,384 A | * | 6/1986 | Kleijne | ................... G06F 21/87 235/487 |
| 5,898,370 A | * | 4/1999 | Reymond | ............ G06K 19/073 340/540 |

(Continued)

FOREIGN PATENT DOCUMENTS

| | | |
|---|---|---|
| CN | 1897787 A | 1/2007 |
| CN | 101036155 A | 9/2007 |

(Continued)

OTHER PUBLICATIONS

D. Vasile and P. Svasta, "Protecting the Secrets: Advanced Technique for Active Tamper Detection Systems," 2019 IEEE 25th International Symposium for Design and Technology in Electronic Packaging (SIITME), Oct. 2019, pp. 212-215 (Year: 2019).*

(Continued)

*Primary Examiner* — Daniel R Miller
(74) *Attorney, Agent, or Firm* — Kimberly Zillig

(57) ABSTRACT

An electronic system can include an electronic module and a trace circuit that provides a perimeter that encloses the electronic module. A sensing circuit within the electronic system can be configured to detect a discontinuity in the perimeter. In response to detecting the discontinuity in the perimeter, the sensing circuit can initiate, from a response device, a response signal.

18 Claims, 5 Drawing Sheets

(56) References Cited

U.S. PATENT DOCUMENTS

| | | | |
|---|---|---|---|
| 6,355,316 B1* | 3/2002 | Miller | G06F 21/87 |
| | | | 428/13 |
| 7,788,801 B2 | 9/2010 | Oggioni | |
| 7,791,898 B2 | 9/2010 | Peytavy | |
| 7,915,540 B2 | 3/2011 | Oggioni | |
| 8,641,618 B2 | 2/2014 | Jennewine et al. | |
| 8,938,627 B2 | 1/2015 | Oggioni | |
| 9,554,477 B1* | 1/2017 | Brodsky | H05K 3/22 |
| 9,582,465 B2 | 2/2017 | Hyde et al. | |
| 2003/0009683 A1* | 1/2003 | Schwenck | G06F 21/87 |
| | | | 713/194 |
| 2007/0038865 A1 | 2/2007 | Oggioni | |
| 2008/0028477 A1 | 1/2008 | Lehmann | |
| 2008/0036598 A1 | 2/2008 | Oggioni | |
| 2009/0196418 A1* | 8/2009 | Tkacik | H04L 9/0894 |
| | | | 380/46 |
| 2010/0327856 A1* | 12/2010 | Lowy | G06F 21/86 |
| | | | 324/207.16 |
| 2014/0033331 A1* | 1/2014 | Salle | G06F 21/87 |
| | | | 726/34 |
| 2015/0380786 A1 | 12/2015 | Hong et al. | |

FOREIGN PATENT DOCUMENTS

| | | |
|---|---|---|
| CN | 101258552 A | 9/2008 |
| CN | 102474977 A | 5/2012 |
| EP | 1746872 B1 | 5/2012 |
| JP | 2014185190 A | 10/2014 |

OTHER PUBLICATIONS

International Search Report and Written Opinion for Applicant file reference P201902476, International application No. PCT/IB2020/060842, International filing dated Nov. 18, 2020, dated Feb. 25, 2021, 10 pages.

Ghomian et al., "Survey of energy scavenging for wearable and implantable devices," Energy, 178, 2019, pp. 33-49.

Doyle et al., "Leakage Characterization for Electronic Circuit Temperature Monitoring," U.S. Appl. No. 16/702,077, filed Dec. 3, 2019.

* cited by examiner

100 Electronic System

125 Electronic System
(Side Cross-Sectional View)

150A Trace Circuit
(Top View)

150B Trace Circuit
(Side View)

LEAKAGE CHARACTERIZATION AND MANAGEMENT FOR ELECTRONIC CIRCUIT ENHANCEMENT

BACKGROUND

The present disclosure generally relates to an electronic system. In particular, this disclosure relates to an electronic system configured to detect a discontinuity in the perimeter enclosing an electronic module.

A printed circuit board (PCB), can be used to mechanically support and electrically connect electronic components using conductive paths or signal traces etched from copper sheets laminated onto non-conductive substrates. Multiple copper/insulator layer pairs, also known as "cores," can be laminated together in the fabrication of the PCB. The number and arrangement of cores can be designed to fit the needs of a variety of applications.

Vertical interconnect structures (vias) can be used to interconnect conductive signal traces between various conductive layers within the PCB. Copper shapes or areas can be used for power and ground distribution to components mounted on the PCB. The interconnect structures in the PCB can be designed to be physically and electrically compatible with the components the PCB can be used to interconnect.

Flexible printed circuits, also known as "flex circuits," or "flex cables," can be generally understood to be similar to a PCB that can bend. In practice, however, the set of design rules, e.g., conductor widths and spacings, used to design and fabricate flex circuits can vary significantly from design rules used in the design and fabrication of rigid or semi-rigid PCBs. In some applications, the conductors of a flex circuit can be fabricated using process such as photo imaging or laser imaging as the pattern definition method rather than a "printing" processes.

A flexible printed circuit includes a metallic layer of traces, often copper, bonded to a dielectric layer such as polyimide. The thickness of the metal layer can range from very thin, e.g., less than 0.0001" to very thick, e.g., greater than 0.010", and the dielectric thickness can similarly vary in a range between 0.0005" and 0.010". An adhesive material or other types of bonding such as vapor deposition, can be used to bond the metal to the substrate. Because copper tends to readily oxidize in the presence of air, exposed copper surfaces are often covered with a protective layer. Gold or solder are common materials used for this purpose, due to their electrical conductivity and environmental durability. For non-contact or non-conductive areas a dielectric material can be used to protect the circuitry from oxidation or electrical shorting. Electrical leakage, i.e., current leakage, can occur through dielectric materials located between adjacent metallic layers.

SUMMARY

Embodiments can be directed towards an electronic system. The electronic system includes an electronic module, a trace circuit providing a perimeter that encloses the electronic module and a sensing circuit. The sensing circuit is configured to detect a discontinuity in the perimeter. The sensing circuit is further configured to initiate, in response to a detection, an action from a response device.

Embodiments can also be directed towards a method for designing an electronic system for managed battery life and managed electronic data security for an electronic module. The method includes receiving design requirements for the electronic system and characterizing dielectric materials that are candidates for use in the electronic system. The method further includes choosing, from candidate dielectric materials, a dielectric material in accordance with the design requirements and designing a trace circuit to include a chosen dielectric material. The method further includes fabricating the trace circuit in accordance with the trace circuit design and integrating the trace circuit into the electronic system. The integrating of the trace circuit into the electronic system includes surrounding the electronic module with the trace circuit to provide a perimeter that encloses the electronic module and electrically interconnecting the trace circuit to a sensing circuit.

Embodiments can also be directed towards a method for operating an electronic system for managed battery life and managed electronic data security for an electronic module. The method includes applying, with a sensing circuit, a voltage to a trace circuit configured to provide a perimeter that encloses an electronic module and measuring, with the sensing circuit, a sensed voltage on the trace circuit. The method further includes comparing the sensed voltage to a voltage threshold to detect a discontinuity in the perimeter and initiating, with a response device electrically interconnected to the sensing circuit, an action in response to the sensed voltage indicating the discontinuity in the perimeter.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

Figure 1:
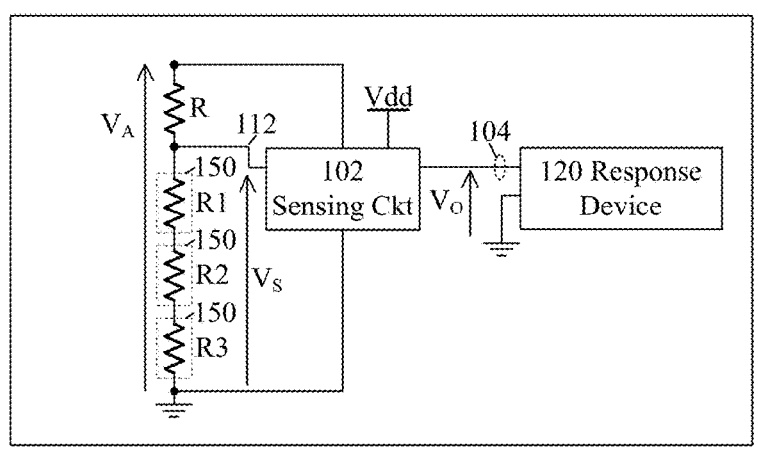
FIG. 1 depicts an electronic system configured for managed battery life and electronic data security, according to embodiments of the present disclosure.
Figure 1:
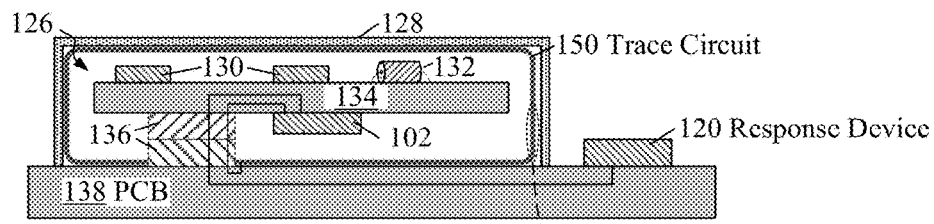
Figure 1:
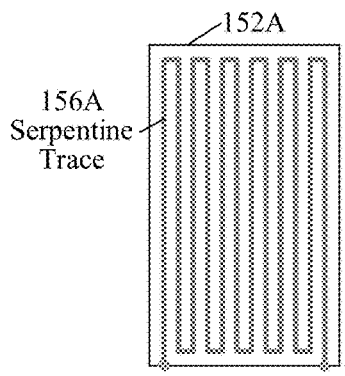
Figure 1:
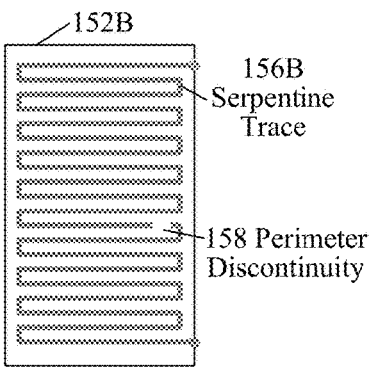
Figure 1:
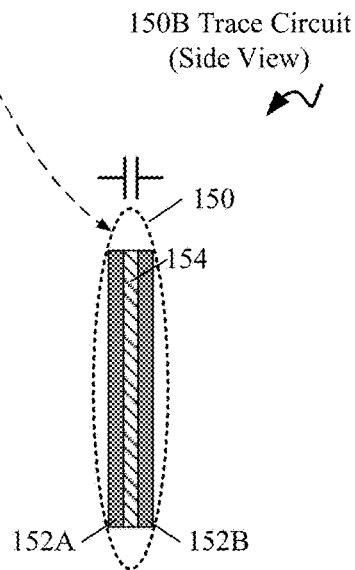

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing detection of a discontinuity in a perimeter enclosing an electronic module within electronic equipment such as servers, which can be used to provide data to clients attached to a server through a network. Such servers can include, but are not limited to, web servers, application servers, mail servers, and virtual servers. While not necessarily limited thereto, embodiments discussed in this context can facilitate an understanding of various aspects of the disclosure. Certain embodiments can also be directed towards other equipment and associated applications, such as providing detection of a discontinuity in a perimeter enclosing an electronic module within computing systems, which can be used in a wide variety of computational and data processing applications. Such computing systems can include, but are not limited to, supercomputers, high-performance computing (HPC) systems, and other types of special-purpose computers. Embodiments can also be directed towards providing detection of a discontinuity in a perimeter enclosing an electronic module within consumer and small office/home office (SOHO) electronic equipment such as personal computers, laptops, mobile and network server devices.

For ease of discussion, the term "FR" is used herein, in reference to a class of Fire Retardant glass fiber epoxy laminate materials. FR materials, particularly FR4, are widely and commonly used in the construction of a wide variety of printed circuit boards (PCBs). FR4 is designed for use in high-density multi-layer PCBs, and is suitable for high volume fine-line/multi-layer applications. Similarly, the term "AP" is generally used herein, in reference to a class of Adhesive-less/high-Performance laminate materials that include a copper-clad laminate and an all-polyimide composite of polyimide film bonded to copper foil. Such materials can be used in constructing multilayer flex and rigid flex applications which require advanced material performance, temperature resistance, and high-reliability. The term "HT" is generally used herein, in reference to a class of High Temperature laminate materials that feature favorable material and electrical characteristics. Such materials can have a higher glass transition temperature ($T_g$) and lower loss characteristics (e.g., loss tangent) than materials such as FR4.

A need for storage of secure/confidential data and inclusion of cryptographic functions within electronic systems has resulted in the implementation of a variety of devices and techniques to detect and respond to attempted unauthorized tampering of such systems. Potentially vulnerable systems can include, but are not limited to, computers, servers, supercomputers, personal computers, network and telecom systems. Tampering with such systems can result in unauthorized access to confidential and/or sensitive information such as financial, military or classified data, Sensitive Personal Identifying Information (PII), or cryptography keys.

A trace circuit, including one or more layers of electrically conductive traces fabricated in a serpentine arrangement, can be useful in detecting attempts at intrusive tampering of electronic devices and modules. Attempted tampering, i.e., drilling, cutting, and the like, of a trace circuit can provide a detectable indication, e.g., an electrical discontinuity, of such tampering. A response devices such as a processor or other circuit can then respond to the detected tampering in a variety of ways to warn of and/or mitigate a security risk.

Electrical structures such as flexible circuits and/or PCBs that include serpentine traces can exhibit significant electrical leakage between adjacent trace layers and/or power distribution layers, particularly when serpentine traces are arranged in adjacent parallel-planar orientations. In some applications, a data/cryptography security system that includes one or more trace circuits can be powered by an internal battery. The electrical leakage of adjacent trace circuits to other trace circuits and/or power distribution planes can effectively shorten the life of the battery that powers the security system. Such diminished battery life can jeopardize the security of data within the system.

Embodiments of the present disclosure are directed towards a system to monitor trace circuit continuity within an electronic system such as a computer, server, supercomputer or network system. The continuity monitoring system includes a trace circuit that serves as a perimeter surrounding an electronic module, and that can provide an indication of a discontinuity of the perimeter. Embodiments include a trace circuit constructed with one or more dielectric materials that are characterized, chosen, and designed into the trace circuit in order to manage and minimize leakage current. Such managed dielectric leakage current can be particularly useful in extending and enhancing the operating life of a battery that powers the trace circuit continuity monitoring system, which can result in enhance and extended security for sensitive electronically stored data and encryption keys/data. Such enhanced security can result in managed and minimized loss of sensitive/confidential data and/or encryption capabilities.

Various aspects of the present disclosure can be useful for monitoring the continuity of trace circuit(s) configured to provide a security perimeter for an electronic system. Such monitoring can provide enhanced security for electronically stored data and encryption keys within the system. An electronic system configured according to embodiments can monitor the continuity of such trace circuit(s) while consuming less energy and providing extended battery life, relative to other such electronic security systems. Embodiments can be configured to respond to detected tampering/violations of the security perimeter of the electronic system through sending warning messages, activating alarms or visual indicators, and destroying secure/confidential data and/or encryption keys. Such actions can be beneficial in enhancing the security of electronic data within the electronic system.

Embodiments of the present disclosure can also be useful in reducing energy consumption of a security monitoring system through reducing dielectric leakage, and resulting RC time constant ($\tau$) of one or more trace circuit(s) within the system. The reduction of $\tau$ can be particularly useful in reducing response time of sensing circuits, which can reduce both the complexity and energy consumption of such sensing circuits. Dielectric leakage reduction can also allow the reduction of trace circuit resistance.

Various aspects of the present disclosure can be useful in allowing probing of the sensing circuit through the use of commonly used/available voltmeters and/or oscilloscopes having high input impedances. Embodiments of the present disclosure can also be useful in managing electronic system design cost and complexity while using existing and proven PCB design methodologies and material sets. An electronic system designed according to certain embodiments can be compatible with existing and proven computer, server, supercomputer and personal computer (PC) designs and PCB/flexible circuit design methodologies and material sets. A electronic perimeter security monitoring system constructed according to embodiments of the present disclosure can be installed within an existing electronic equipment enclosure.

Certain embodiments relate to an electronic system configured to provide managed battery life and electronic data security for an electronic module and to initiate an action when a discontinuity in a perimeter surrounding the electronic module is detected. FIG. 1 includes consistent views 100, 125, 150A and 150B depicting an electronic system for managed battery life and electronic data security and a trace circuit 150, according to embodiments of the present disclosure.

View 100 can provide an understanding of the electronic system that includes multiple instances of a trace circuit 150, sensing circuit 102 and response device 120. According to embodiments, sensing circuit 102 is electrically interconnected to and configured to monitor the continuity of the trace circuits 150. In response to sensing circuit 102 detecting a discontinuity within a trace circuit 150, response device 120 can initiate an action designed to warn about and/or mitigate a data security condition/issue within the electronic system 100, 125. In such embodiments, electronic system 100 functions as a data security system.

It can be understood that electronic system 100, 125, can be integrated into a wide variety of electronic devices and systems such as computers, servers, special-purpose computers, supercomputers and personal computers (PCs). Such systems can rely on the monitoring of trace circuit continuity in order to ensure robust, continuous data security. In some embodiments, electronic system 100 can function as a cryptography security system. While a particular component arrangement and interconnection scheme is depicted in views 100, 125, a number of variations of these schemes are possible that include the components depicted and described herein. Embodiments can be useful in providing accurate sensing of, and a timely response to breaches of a perimeter for an electronic system. Such sensing and timely response(s) can be particularly useful in preventing and issuing warnings regarding unauthorized access to secure data and/or encryption keys stored on the electronic system.

According to embodiments, trace circuit 150 can include one or more conductive serpentine trace(s), consistent with signal traces formed on flexible circuit, which can be used to detect perimeter discontinuities. For example, a discontinuity in trace circuit 150 could be caused by attempts to cut, drill, or otherwise breach the perimeter provided by cover 128 surrounding electronic module 126. In the event of such action(s), perimeter discontinuity 158, view 150A, can be created. Relatively close conductor spacings, e.g., 4 mils, within the serpentine trace(s), 156A, 156B, can be particularly useful in the creation of such perimeter discontinuity 158 in response to attempts to breach/violate a perimeter formed by trace circuit(s) 150. The resistance, e.g., R1, R2, and/or R3 can be sensed by sensing circuit 102 and used as an indicator of the continuity of trace circuit 150.

In embodiments, trace circuit 150 includes dielectric material(s) 154 located between, and in electrically conductive contact with two electrically conductive layers 152A, 152B, which serve as electrical terminals. According to embodiments, the two electrically conductive layers 152A, 152B can each be a planar structure, such as a power plane of a PCB or flexible circuit. According to embodiments, trace circuit 150 can be a portion of one or more flexible circuit(s) that at least partially surrounds electronic module 126 within electronic system 100, 125. Similarly, in some embodiments, trace circuit 150 can represent a portion of a PCB at least partially surrounding electronic module 126, view 100 depicts three trace circuits 150 electrically interconnected in a series configuration In some embodiments, electronic module 126 can be a cryptographic module, and a perimeter provided by trace circuit 150 can be a secure perimeter surrounding the cryptography module. In such embodiments, the sensing circuit 102 can be configured to detect an attempted violation of the secure perimeter. According to embodiments, the placement of trace circuit(s) 150 attached or adjacent to inside surfaces of cover 128 can allow it to act as a secure perimeter that surrounds or partially surrounds electronic module 126. Such a secure perimeter can be particularly useful in detecting attempted breaches from a wide variety of locations.

Resistances R1, R2 and R3 of trace circuits 150, in conjunction with resistor R, electrically connected to sensing circuit 102, sense net 112 and GND, act as voltage divider circuit. When interconnected in such a circuit, the continuity of series-connected trace circuits 150, view 100, as represented by the sum of resistances R1, R2 and R3, can be determined by measuring, with sensing circuit 102, a sense voltage $V_S$, on sense net 112.

According to embodiments, sensing circuit 102 is configured to supply applied voltage $V_A$ to the above-described voltage divider circuit. In the case where there is continuity across each trace circuit 150, the sense voltage $V_S$ sensed at sense net 112 of sensing circuit 102 will be $V_A*(R1+R2+R3)/(R+R1+R2+R3)$. In the case where there is a discontinuity in any of the trace circuit(s) 150, the sense voltage $V_S$ will be approximately $V_A$, for example, $V_{DD}$. The values of R, R1, R2 and R3 can be chosen such that a $V_S$ resulting from continuity across each trace circuit 150 is significantly different than a $V_S$ resulting from a discontinuity in any of the trace circuit(s) 150. Such a difference in $V_S$ values can be detected by sensing circuit 102, and converted into output voltage $V_O$. According to embodiments, sensing circuit 102 can include, for example, a comparator configured to convert voltage $V_O$ into a logic signal, i.e., either a logical "0" or "1" value. Such a signal can be used to indicate either intact continuity across all series-connected trace circuit(s) 150, or a perimeter discontinuity, e.g., 158, to response device 120. In some embodiments, sensing circuit 102 can be configured to sense the continuity of trace circuit(s) 150 continuously, and in some embodiments, sensing circuit 102 can be configured to periodically sense the continuity of trace circuit(s) 150.

According to embodiments, electronic system 100 can include any number of trace circuits 150 in a series-connected configuration, as depicted, in order to provide a robust perimeter that surrounds electronic module 126 within cover 128. For example, in some embodiments, electronic system 100 can include a single trace circuit(s) 150, two trace circuits 150 or three or more trace circuits 150. Sensing circuit 102 is depicted as an example circuit; other types of sensing circuits 102 are possible. In embodiments, the functionality of sensing circuit 102 can be relatively simple to implement as discrete components or into an existing or new IC such as an application-specific integrated circuit (ASIC).

In some embodiments, output 104 can be a single analog or digital signal wire. In some embodiments, sensing circuit 102 can include additional components, not depicted, configured to convert output voltage $V_O$ into other type of signal(s), for example, a high-speed serial signal representing an output voltage $V_O$. In corresponding embodiments, output 104 can, for example, including conductors configured to transmit a representation of $V_O$ as a high-speed serial signal such as a Universal Serial Bus (USB) signal.

Response device 120 is electrically connected to the sensing circuit 102 through output 104 to receive output voltage $V_O$. According to embodiments, response device 120 can include, but is not limited to, a processor circuit, a service processor, the electronic module 126 and a network-connected device. In some embodiments, response device 120 is configured to, in response to the output voltage $V_O$ indicating a lack of continuity, e.g., discontinuity 158, view 150A in a trace circuit 150, initiate an action. According to embodiments, the action can include, but is not limited to, sending a message, e.g., text message, system console message or Short Messaging Service (SMS) message alerting a system user or technician of a discontinuity in the perimeter surrounding electronic module 126. In some embodiments, actions can also include illuminating an indictor such as a light-emitting diode (LED), sounding an audible alarm and/or deleting encryption keys within the electronic module 126. One or a combination of the above-described actions can be useful for protecting security of data and/or encryption keys contained within electronic module 126.

According to embodiments, electronic system (side cross-sectional view) 125 can be useful in providing a visual understanding of component interconnection and arrangement within electronic system 100, 125. The function, electrical characteristics and interconnections of electronic system 125 are consistent with those described above in reference to electronic system 100. View 125 can be particularly useful in depicting structural, placement, and electrical interconnection relationships between electronic module 126, cover 128, trace circuit 150, connector 136, PCB 138 and response device 120.

According to embodiments, electronic module 126 can be configured to store and/or process electrically stored data that is sensitive or secure. Electronic module 126 can include ICs 130, such as processors, memory devices, ASICs, and cryptography chips, that are mounted and electrically interconnected on a PCB 134. A sensing circuit 102 can be powered by a battery, e.g., 132, which can enable it to provide continuous detection of a perimeter discontinuity, e.g., 158, trace circuit 150, in the event that electronic module 126 is disconnected from an electronic system power supply. Connector 136 provides electrical interconnections between electronic module 126 and other components and/or devices within electronic system 125, for example, output 104 from sensing circuit 102 to response device 120, mounted on PCB 138. According to embodiments, PCB 138 can be an integral part of a computer, supercomputer, server, PC, or other electronic system. In some embodiments, the electronic module 126 can be a cryptography module.

Electronic module 126 can be enclosed by cover 128, which can be designed to inhibit visual inspection and physical access to electronic module 126. According to embodiments, trace circuit 150 can be attached to inside surface(s) of cover 128, using, for example, adhesives or other bonding agents or techniques. In embodiments, a dielectric layer, e.g., 154 can be chosen by a designer, based on material characterization data, in order to conform to electronic system design requirements. Such requirements can include, for example, a maximum dielectric leakage specification. The use of a dielectric layer, e.g., 154, that has managed and/or reduced leakage characteristics, can be particularly useful in reducing power consumption of electronic system 100, and thereby increasing and extending the life of battery 132 used to power the electronic system 100.

The use of trace circuit 150 can be helpful in providing cost-effective detection of unauthorized physical access to sensitive data and/or encryption keys stored on electronic module 126. Trace circuit 150 can also be particularly useful in managing and reducing leakage between electrically conductive layers 152A and 152B, which can provided managed and enhanced operational life of battery 132. Example dielectric material types that can be used in dielectric layer 154 of trace circuit 150 can include, but are not limited to FR, HT and AP laminate materials layers. According to embodiments, electrically conductive layers 152A and 152B of trace circuit 150 can include serpentine traces 156A, 156B, respectively, that serve as a perimeter that encloses the electronic module 126. In accordance with PCB designs and material sets, conductive layers 152A and 152B can include copper and/or other types of metal.

According to embodiments, serpentine traces can have a variety of patterns, as depicted in 156A, 156B, view 150A. A trace circuit 150 can include one or more electrically conductive layers, e.g., 152A, 152B. In some embodiments, electrically conductive layers, e.g., 152A, 152B are electrically insulated from each other by a dielectric layer, e.g., 154. In embodiments, trace circuit 150 includes a dielectric layer 154 located adjacent to, i.e., between, both conductive layers 152A and 152B. Trace circuit 150 can include a single conductive layer, e.g., 152A, and in some embodiments trace circuit 150 can include two or more conductive layers, e.g., 152A and 152B, as depicted. In embodiments, various types of adhesives and/or bonding agents can be used to bond trace circuit 150 to inside surfaces of cover 128. Reference 158 is depicted in view 150 as a flexible circuit, however, in some embodiments, 158 can alternately represent a PCB. In some embodiments, flexible circuits or PCBs can be electrically interconnected by the soldering in order to form a perimeter that surrounds multiple sides, e.g., top, bottom, and sides of electronic module 126.

FIG. 1 and the components depicted in FIG. 1 are not necessarily representative of the actual size of the components or subcomponents individually or collectively used in embodiments. They are not necessarily a representation of the actual or relative size of any device, component of subcomponent. Rather, they are meant to depict how each sub-component of an electronic system can be arranged relative to other sub-components in accordance with embodiments of the present disclosure.

Figure 2:
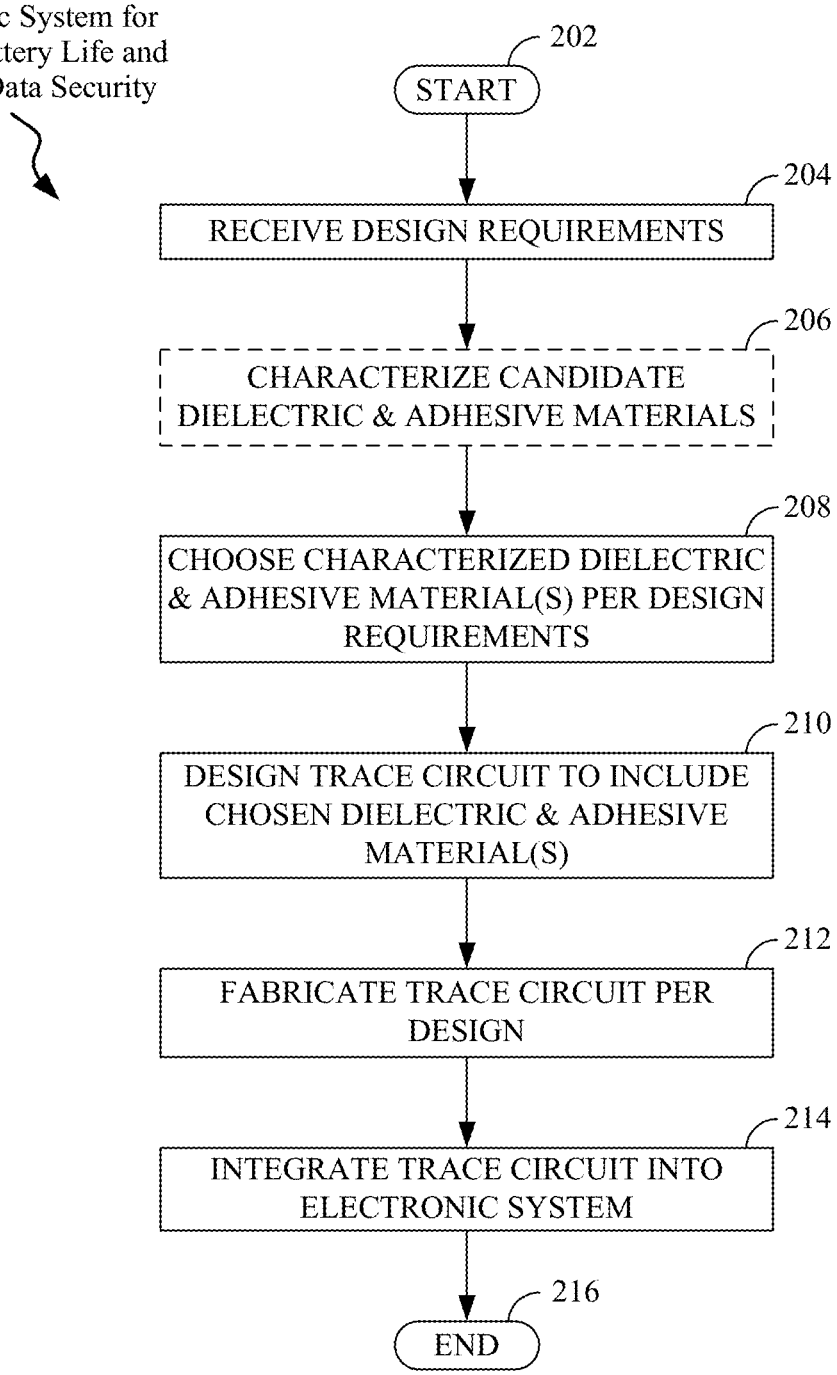
FIG. 2 is a flow diagram depicting a method for designing an electronic system for managed battery life and electronic data security, according to embodiments consistent with the figures.

FIG. 2 is a flow diagram depicting a method 200 for designing an electronic system 100, 125, FIG. 1, for managed battery life and electronic data security, according to embodiments consistent with the figures. The execution of method 200 can be useful in designing an electronic system that can provide reliable, cost-effective and energy-efficient data security monitoring and corrective action responses for use with electronic systems such as computers and servers. In association with a functioning electronic system, method 200 can provide improved energy-efficiency and battery operating life the electronic system. In some embodiments, the electronic system 100 can be a cryptography security system.

The method 200 moves from start 202 to operation 204. Operation 204 generally refers to receiving design requirements for the electronic system 100, 125, FIG. 1, for managed battery life and electronic data security. According to embodiments, design requirements can include, for example, specified leakage characteristics of the trace circuit 150, FIG. 1, over a range of electronic system operating temperatures and a specified impedance range, across the electrically conductive layers, e.g., 152A, 152B, of trace circuit 150, FIG. 1. Other design requirements can include, for example, specified maximum voltage droop, energy loss and RC time constant ($\tau$) across the conductive layers of dielectric 150. Design requirements can also include a minimum operational life of a battery, e.g., 132, FIG. 1, configured to power the electronic system 100, FIG. 1. In some embodiments, the minimum operational life of a battery can be specified by a published cryptosecurity specification such as the U.S. Government Federal Information Processing Standard (FIPS) 140-2 Security Requirements for Cryptographic Modules.

According to embodiments, each of these requirements may need to be satisfied in order to meet the overall design requirements for an electronic system. In embodiments, the design requirements can be received by a circuit designer or electronic design automation (EDA) system from a specification document or file. Such a document or file can have, for example, the form of a printed copy or electronic file. The electronic file can have a variety of formats such as a word processing document, text file, spreadsheet file or a proprietary or non-proprietary specifications file.

It can be understood that various electronic systems can have different design requirements. For example, one type of electronic system, e.g., electronic module 126, FIG. 1, can be portable and/or depend at least partially on battery power and require a relatively small maximum dielectric leakage. In some embodiments, the electronic module 126 can be a cryptography module. In contrast, another type of electronic system may not depend at all on battery power, can have a trace circuit 150 specified to be more compatible with a particular sensing circuit 102 design, and may have a larger specified leakage current. Once the design requirements have been received, the method 200 moves to operation 206.

Figure 3:
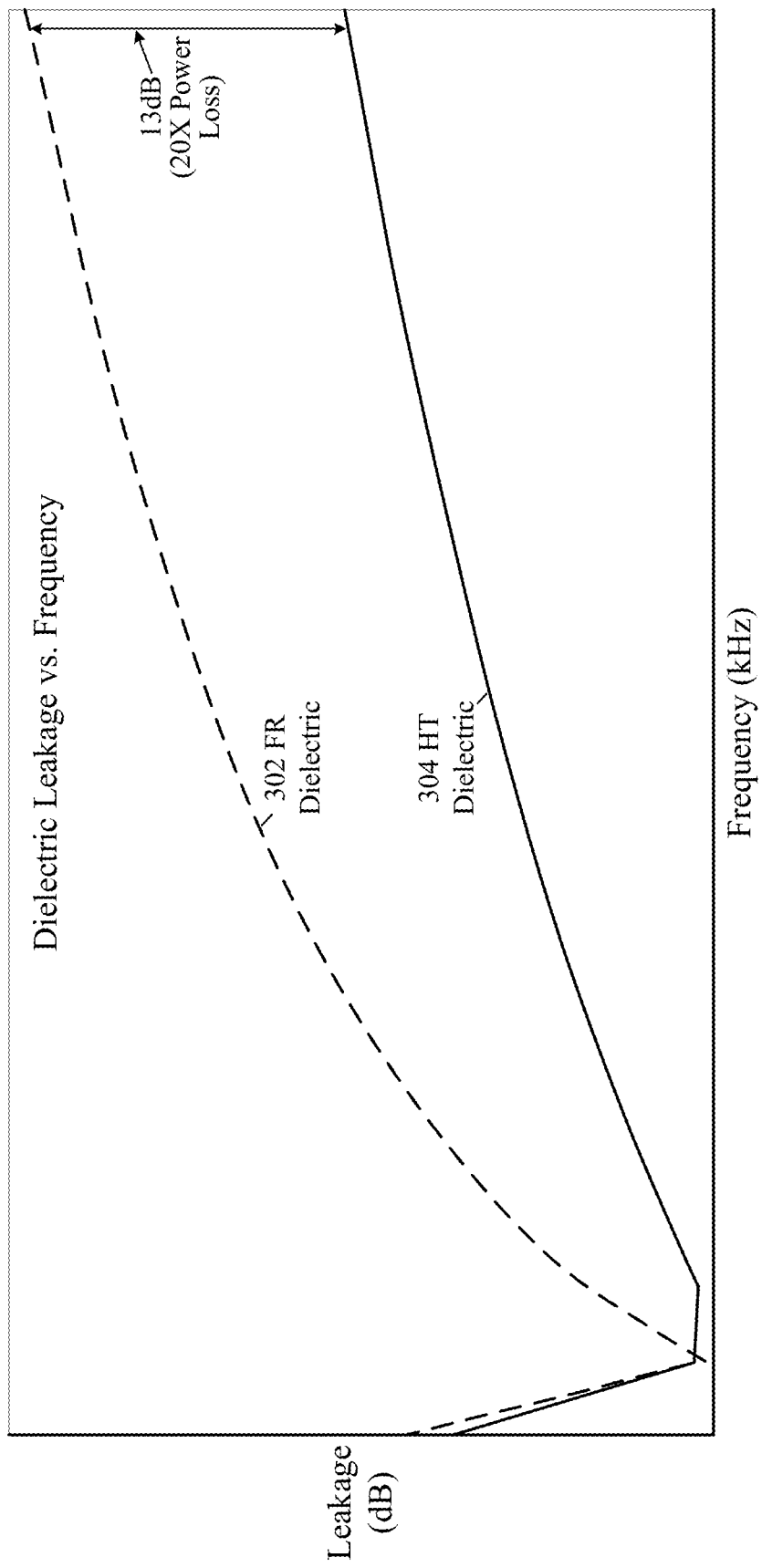
FIG. 3 includes a graph depicting dielectric leakage measurements for two dielectric materials, according to embodiments consistent with the figures.

Optional operation 206 generally refers to characterizing candidate dielectric and adhesive dielectric materials for use within the electronic system 100, 125, FIG. 1. Such dielectric materials can include, for example, dielectric material sheets with a metallic, e.g., copper, cladding on one or both sides of the dielectric and various adhesive dielectric materials. According to embodiments, candidate dielectric and adhesive materials can be characterized in order to provide PCB and circuit designers with parameters that are useful in making design decisions and tradeoffs. For example, a dielectric material can be subjected to various frequencies applied to conductive plates on planar surfaces of the material, and resulting loss can be recorded. FIG. 3 is an example graph including plots of measured loss vs. frequency for two dielectric materials FR and HT. According to embodiments, characterizing candidate dielectric and adhesive can include characterizing electrical leakage properties, including temperature-dependant electrical leakage variation, of the candidate dielectric and adhesive materials. In embodiments, candidate dielectric and adhesive materials can include, but are not limited to, FR, HT and AP materials.

The above-described characterization can be performed, for example, by a vendor or supplier of dielectric materials, by a circuit or PCB designer, or by an independent laboratory. Such characterization can be performed at one or more temperatures of interest, such as an anticipated maximum operating temperature, or across an operating temperature range of an electronic system. Once candidate dielectric and adhesive materials have been characterized, the method 200 moves to operation 208.

Operation 208 generally refers to choosing characterized dielectric and adhesive materials in accordance with the design requirements received in operation 204. According to embodiments, dielectric and adhesive materials are chosen, by a designer, from a number of characterized dielectric and adhesive materials, for example, FR, HT, and AP dielectric materials. In some embodiments, a dielectric material and a supplemental dielectric material can be combined in order to take advantages of the electrical and/or physical properties of both materials. One or more dielectric material can be chosen, based on variety of properties individual materials and properties of proportionally combined materials. These properties can include, for example, temperature-dependent leakage and loss characteristics, dielectric constant and adhesion properties. According to embodiments, the choosing of a dielectric material in accordance with the design requirements can include selecting a dielectric material having a characterized electrical leakage that is less than a specified electrical leakage value. In some embodiments, the dielectric material can be chosen based upon a characterized electrical leakage that varies less than a specified amount over an operating temperature range. Choices of dielectric materials can be made in conjunction with analysis of output from EDA program such as a field-solver or other electrical simulation program.

In some embodiments, an inherently long serpentine trace, e.g., 156A, FIG. 1, can result in a relatively large RC time constant ($\tau$) for the trace circuit trace circuit 150, FIG. 1. A large value of $\tau$ can result in excessive settling times for a sensing circuit 102, FIG. 1, and in energy consumption from a battery, e.g., 132, FIG. 1. Current leakage across a dielectric layer 154, FIG. 1, can also serve to increase $\tau$.

According to embodiments, choosing characterized dielectric and adhesive materials having reduced leakage, in accordance with design requirements received in operation 204 can be particularly useful in reducing dielectric current leakage, and as a result, $\tau$. Reducing the value of $\tau$ can improve response times for sensing circuit 102, FIG. 1, and energy consumption from a battery 132, FIG. 1. According to embodiments, such reductions in dielectric leakage can span a range of electronic system operating temperatures. In embodiments, choosing a characterized dielectric can include, for example, choosing an HT dielectric material over an FR dielectric material. Other choices can be made in the spirit and scope of the present disclosure.

In some embodiments, by way of example, a choice of characterized dielectric and adhesive materials having lower dielectric leakage can yield a reduction of $\tau$ by approximately 50%. As a result of reduced leakage, trace circuit resistance can be reduced by a factor of 5, to yield an overall power savings that can improve battery operating life by approximately 10%. In some applications, such an improvement in operating life can result in an additional 6-9 months of battery-powered operation.

In addition to the benefits of reduced power consumption, reducing leakage current through dielectric material selection can also enable detection of a significantly higher trace resistance, thus allowing probing of a trace circuit with commonly used or available voltmeters or oscilloscopes having an input impedance in a 1 M$\Omega$ to 10 M$\Omega$ range. According to embodiments, a sensing circuit 102, may not be required to have hysteresis input characteristics, thereby further reducing sensing circuit complexity and power consumption.

Choosing a dielectric material based upon a characterized electrical leakage can be particularly useful for managing electrical leakage from a serpentine trace, e.g., 156A, FIG. 1, to another serpentine trace serpentine trace, e.g., 156B, FIG. 1, or to another layer such as a power or ground distribution layer. This managed electrical leakage can result in an enhanced operational life of a battery, e.g., battery 132, FIG. 1, configured to power an electronic module, e.g., 126, FIG. 1. Once the characterized dielectric and adhesive materials have been chosen, the method 200 moves to operation 210.

Operation 210 generally refers to designing a trace circuit to include characterized dielectric and adhesive materials chosen in operation 208. According to embodiments, designing a trace circuit can include selecting a particular plane pair in a PCB or flexible circuit design, a volume/amount(s) of characterized dielectric material that satisfies dielectric leakage design requirements. A characterized dielectric material can include a combination of a dielectric material and a supplemental dielectric material. In some embodiments, more than one plane pair can be used, and in some embodiments, an EDA program such as a field-solver or other type of electrical simulation program can be used in the design process. Once the trace circuit has been designed, the method 200 moves to operation 212.

Operation 212 generally refers to fabricating a trace circuit in accordance with the trace circuit design completed in operation 210. According to embodiments, the trace circuit 150, FIG. 1, can be fabricated in accordance with the design of operation 210. In some embodiments, the trace circuit 150, FIG. 1, can be subsequently bonded to other PCB and/or flexible circuit layers. Various lamination, etching, drilling, and other process steps used in operation 212 are generally consistent with existing PCB and/or flexible circuit fabrication and assembly processes. Once the trace circuit has been fabricated, the method 200 moves to operation 214.

Operation 214 generally refers to integrating the trace circuit, e.g., 150, FIG. 1, into the electronic system 100, 125, FIG. 1. According to embodiments, the integrating can include placing and attaching one or more trace circuits 150 to inside surface(s) of cover 128, in order to surround and enclose the electronic module 126 with a perimeter. In some embodiments, the perimeter is a secure perimeter surrounding the cryptography module, and the sensing circuit 102 is configured to detect an attempted violation of the secure perimeter. Various types of adhesives and/or bonding techniques can be used in the attachment process. According to embodiments, the integrating can also include electrically interconnecting one or more trace circuits 150 in series, as represented by resistors R1, R2 and R3, FIG. 1. The integrating can also include electrically interconnecting the trace circuits 150 to sensing circuit 102, for example, through solder connections to conductors in connector 136 and PCB 134. Once the trace circuit has been integrated into the electronic system, the method 200 can end at operation 216.

FIG. 3 is a graph depicting dielectric leakage measurements as a function of frequency of two dielectric materials, according to embodiments consistent with the figures. Such dielectric materials can be used in layers, e.g., dielectric layer 154, FIG. 1, as can be included in a trace circuit 150. Characterization can include a wide variety of such dielectric materials including, but not limited to FR, HT and AP dielectric layers. Characterization & measurement of characteristics such as dielectric leakage can give a PCB designer valuable insight regarding which dielectric materials or dielectric material combination(s) to choose for a particular application.

The data plots provided in FIG. 3 can provide a visual understanding of causal relationships between measurement frequency and dielectric leakage, as well as the relative difference(s) in leakage between various types of dielectric materials. The vertical axis of FIG. 3 corresponds to the leakage, measured in dB, of FR and HT type dielectric materials; a higher value or location on the vertical axis corresponds to a higher leakage value. The horizontal axis at the bottom of FIG. 3 corresponds to a frequency (kHz) at which the leakage measurement is taken. By way of example, a range for the vertical axis can span from approximately −92 dB, at the bottom, to −70 db, at the top.

Similarly, a range for the horizontal axis can span from approximately 0 kHz to 1.0 kHz. Leakage measurements can be taken at a variety of temperatures, such as 25° C., 85° C. or 100° C.

It can be observed that the FR dielectric curve 302 and the HT dielectric curve 304 have appreciably different leakages. For example, at the maximum measurement frequency, (right side of FIG. 4) the leakage difference shown between FR dielectric curve 302 and the HT dielectric curve 304 is approximately 13 dB, corresponding to a 20× difference in power loss between the FR and HT dielectric materials. Measurements for other dielectric material types can yield other relative results. Characterization of dielectric material characteristics such as leakage, as presented in FIG. 3, can be particularly useful for providing an understanding of the electrical characteristics of various dielectric material types, which can be used in choosing between dielectric material types to include in a trace circuit 150 design.

Figure 4:
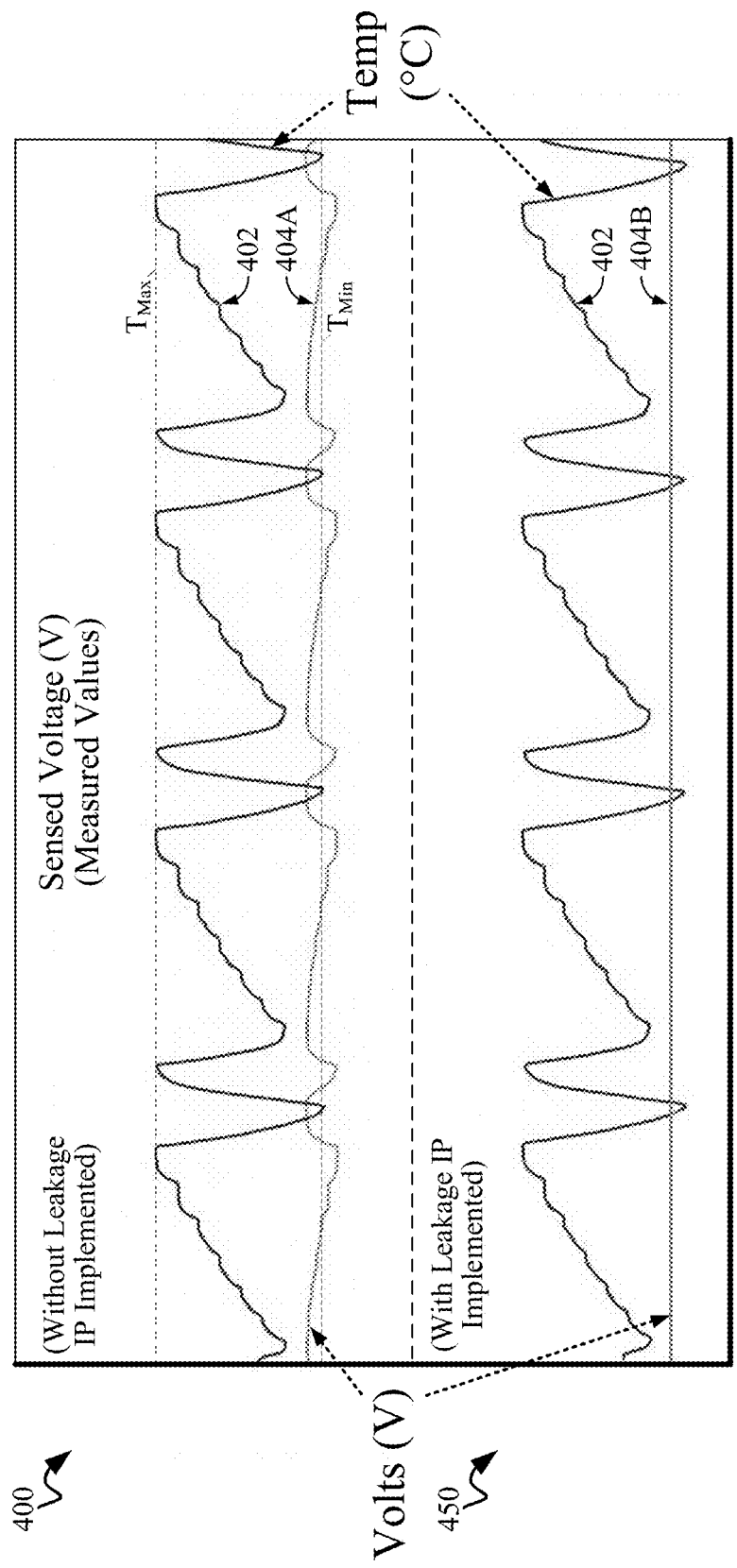
FIG. 4 includes a graph depicting variations in a sensed voltage on a trace circuit, according to embodiments consistent with the figures.

FIG. 4 is a graph including two views 400 and 450 depicting variations in a sense voltage, e.g., $V_S$ of a trace circuit 150, FIG. 1, according to embodiments consistent with the figures. Sense voltage variations can result from variations in leakage, over a range of temperatures, of dielectric materials, e.g., dielectric layer 154, FIG. 1, as may be included in a trace circuit 150. Such materials can include, but not limited to, FR, HT and AP dielectric layers. Characterization of dielectric materials can give a PCB designer valuable insight and understanding regarding which dielectric materials or dielectric material combination(s) to choose for a particular trace circuit application. Choosing a dielectric material having minimal leakage can be particularly useful in managing and/or minimizing electrical leakage and enhancing battery life for an electronic module, e.g., 126, FIG. 1.

The data plots provided in FIG. 4 can provide a visual understanding of causal relationships between measurement temperature and sense voltage $V_S$, as well as the relative difference(s) in sense voltage $V_S$ resulting from the use of various types of dielectric materials. The vertical axis of FIG. 4 for temperature curves 402 corresponds to a measurement temperature, measured in ° C., of FR and HT type dielectric materials; a higher value or location on the vertical axis corresponds to a higher measurement temperature. The vertical axis of FIG. 4 for voltage curves 404A and 404B corresponds to a $V_S$, measured in volts, of FR and HT type dielectric materials, respectively, measured over the temperature range of temperature curve 402. A higher value or location on the vertical axis corresponds to a higher $V_S$ value. Voltage curve 404B represents measured sense voltage, e.g., $V_S$, after implementing dielectric materials of present disclosure, the dielectric leakage of which can be largely independent of operating temperature. The horizontal axis at the bottom of FIG. 4 corresponds to time at which the sense voltage measurement is taken. By way of example, the vertical axis for temperature curves 402, i.e., $T_{MIN}$-$T_{MAX}$, can span from a $T_{MIN}$ of approximately −15° C. to a $T_{MAX}$ of approximately 75° C.

It can be observed that the FR dielectric curve 402 and the HT dielectric curve 404 have appreciably different sense voltage $V_S$ variations corresponding to different temperature-dependent leakages. Characterization of dielectric materials through measurement of sense voltage(s) $V_S$, as presented in FIG. 4, can be particularly useful for providing an understanding of the electrical characteristics of various dielectric material types, which can be used in choosing between dielectric material types to include in a trace circuit 150 design.

Figure 5:
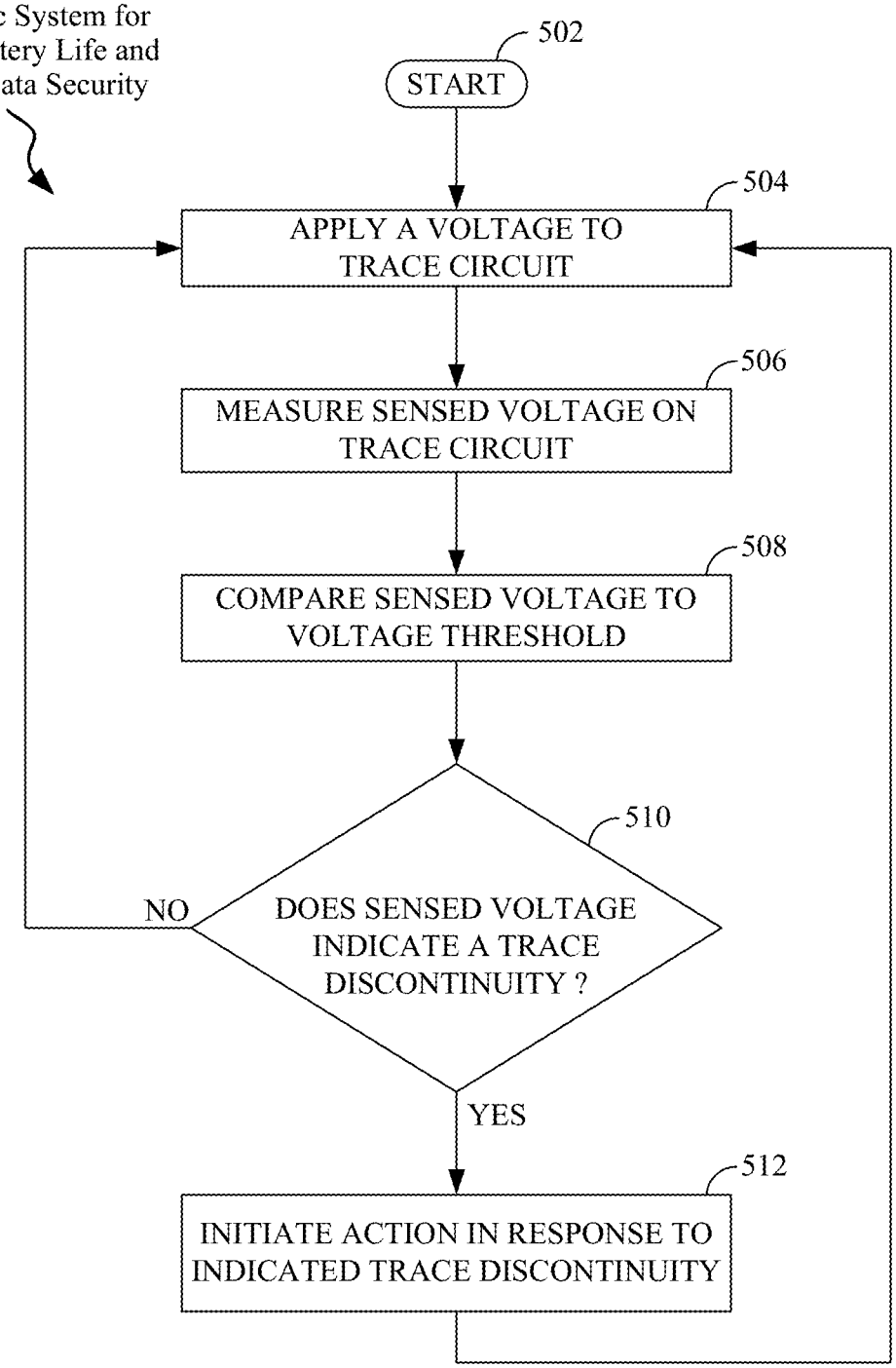
FIG. 5 is a flow diagram depicting a method for operating an electronic system managed battery life and electronic data security, according to embodiments consistent with the figures.

FIG. 5 is a flow diagram depicting a method 500 for operating an electronic system 100, 125, FIG. 1, for managed battery life and electronic data security for an electronic module 126, FIG. 1, according to embodiments consistent with the figures. The execution of method 500 can be useful in providing robust data security for electronic systems and data contained within such systems, while enhancing the effective operating life of a battery, 132, FIG. 1, powering such a system.

The method 500 moves from start 502 to operation 504. Operation 504 generally refers to applying, with a sensing circuit 102, a voltage $V_A$, FIG. 1, to a trace circuit 150, FIG. 1. According to embodiments, trace circuit 150, FIG. 1 can be configured to provide a perimeter that encloses an electronic module 126, and can include a number of series-connected trace circuits, as represented by resistors R1, R2 and R3, FIG. 1. Such trace circuits can be located, for example, adjacent to the top, bottom and/or sides of cover 128. In some embodiments, electronic module 126 can include parts of an electronic system 100, 125, that is a cryptography security system including a cryptography module. Cryptographic modules can include but are not limited to a cryptographic coprocessor, a cryptographic accelerator, a cryptographic adapter card, a cryptographic field programmable gate array (FPGA) and memory storing cryptographic accelerator data.

In some embodiments, the trace circuit(s) 150 can be fabricated as a flexible circuit, and in some embodiments, the trace circuit(s) 150 can be fabricated as a PCB. In embodiments, the voltage $V_A$ applied with sensing circuit 102, FIG. 1, can be, for example, $V_{DD}$, or another voltage selected by a circuit designer. In some embodiments, operation 504 can also include heating the trace circuit(s) 150 to a known or "reference" temperature. Such heating can be useful in detecting minor temperature variations, or in "normalizing" the temperature of trace circuit 150 for compatibility with sensing circuit 102. Once the voltage $V_A$ has been applied to the trace circuit, the method 500 moves to operation 506.

Operation 506 generally refers to measuring, with the sensing circuit 102, FIG. 1, a sense voltage $V_S$ across one or more trace circuits 150, FIG. 1. According to embodiments, if each trace circuit(s) 150 has continuity, i.e., across resistors R1, R2 and R3, a corresponding sense voltage $V_S$ will be present at sense net 112 that indicates continuity. For example, if the values of resistors R1, R2 and R3 are each relatively small compared to the value of resistor R, then the corresponding value of sense voltage $V_S$ will be approximately 0 V.

In a case where at least one trace circuit 150, e.g., resistor R1, R2 or R3, has a discontinuity, e.g., 158, FIG. 1, a corresponding sense voltage $V_S$, e.g., $\approx V_A$ that indicates the discontinuity will be present at sense net 112. According to embodiments, the discontinuity can be understood to represent an attempted violation of the secure perimeter formed by trace circuit 150, FIG. 1, around electronic module 126, FIG. 1. Once the sense voltage $V_S$ has been measured, the method 500 moves to operation 508.

Operation 508 generally refers to comparing, with sensing circuit 102, the sense voltage $V_S$ received at sense net 112, FIG. 1, to a voltage threshold. According to embodiments, the sense voltage $V_S$ serves as an indicator of a perimeter discontinuity for one or more serpentine trace(s) e.g., 156A, FIG. 1. A perimeter discontinuity, e.g., 158, FIG. 1, can result from attempts at unauthorized tampering with cover 128 surrounding electronic module 126. According to embodiments, sensing circuit 102 can be a comparator, operational amplifier (op-amp) or other type of comparison and/or amplifier circuit, which can be implemented with discrete components or integrated within an IC such as an ASIC.

According to embodiments, sensing circuit 102 can be configured to compare sense voltage $V_S$ compared to a threshold that serves to distinguish a $V_S$ corresponding to continuity through trace circuit(s) 150 from a $V_S$ corresponding to a discontinuity in at least one trace circuit(s) 150. For example, in some embodiments, such a threshold voltage can be $V_A/2$. Following this example, a measured $V_S$ that is less than the threshold indicates continuity across the trace circuit(s) 150, FIG. 1, while a measured $V_S$ that is greater than the threshold indicates a discontinuity across at least one of the trace circuit(s) 150, FIG. 1. In some embodiments, a threshold voltage could be another value that depends on the values of resistors R, R1, R2 and R3. Once the output voltage has been compared to a voltage threshold, the method 500 moves to operation 510.

At operation 510, a determination is made by the sensing circuit 102, FIG. 1, regarding whether the sense voltage $V_S$ received by sensing circuit 102 on sense net 112, indicates a discontinuity by violates the voltage threshold discussed above. According to embodiments, for example, if $V_S$ is less than the voltage threshold, it can be determined that there is no discontinuity in any of the trace circuit(s) 150. If $V_S$ is greater than the voltage threshold, it can be determined that there is a discontinuity in at least one of the trace circuit(s) 150. According to embodiments, sensing circuit 102 can be configured to drive output voltage $V_O$ with a logical "0" or a logical "1" value corresponding to a sensed continuity or discontinuity of trace circuit(s) 150. In some embodiments, sensing circuit 102 can be configured to amplify a sense voltage $V_S$ in order to drive output voltage $V_O$. If the sense voltage $V_S$ received at sense net 112, FIG. 1, does not indicate a discontinuity, the method 500 returns to operation 504. If the sense voltage $V_S$ received at sense net 112, FIG. 1, indicates a discontinuity, the method 500 moves to operation 512.

Operation 512 generally refers to initiating, with the response device 120, FIG. 1, in response to an indication of a discontinuity in at least one trace circuit(s) 150, an action. According to embodiments, response device 120 can be, for example, a processor circuit, a service processor, a network-connected device, an electronic module, e.g., 126, FIG. 1, or other electronic device. Response device 120 includes circuits/functionality to receive output voltage $V_O$ from output 104, and, in response to $V_O$ indicating a discontinuity, initiate one or more responsive action(s). For example, sensing circuit 102, FIG. 1, can output an output voltage $V_O$, e.g., a logical "1" represented by $V_{DD}$, to response device 120 that indicates a discontinuity in at least one trace circuit 150. According to embodiments, in response to receiving such a signal, response device 120 can perform an action, or can communicate with another device, e.g., a computer, processor, IC, or network-connected or other electrically interconnected device to initiate the action. For example, response device 120 can initiate an action such as sending a message, issuing an alarm, or deleting encryption keys within the electronic module 126. According to embodiments, a sent message can include, but is not limited to, an email notification, an SMS notification or a system console message. Alarms can include visual or auditory alarms such as illuminating an indicator such as an LED or light, or activating a buzzer, horn, siren or the like. Other types of indications of a perimeter discontinuity 158, FIG. 1, are possible within the spirit and scope of the present disclosure.

Some embodiments of the present disclosure can allow for detection and reaction to attempted, unauthorized inspections of a cryptographic module or device. Embodiments of the present disclosure can provide an indication of an attempted physically intrusive inspection of a secure or cryptographic circuit without imposing permanent and/or negative effects on the functionality of the device or circuit in which it is deployed. Once the action has been initiated, the method 500 returns to operation 504.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An electronic system comprising:
an electronic module;
a cover that encloses the electronic module;
a trace circuit attached to an inside surface of the cover and providing a perimeter that encloses the electronic module, wherein the trace circuit includes a dielectric material located between electrically conductive layers, the dielectric material having:
a characterized electrical leakage that is less than a specified electrical leakage value; and
a characterized electrical leakage that varies less than a specified amount
over an operating temperature range,
wherein the trace circuit further includes a supplemental dielectric material, and wherein amounts of the dielectric material and of the supplemental dielectric material are included that result in a leakage of the trace circuit that is less than a leakage threshold value; and
a sensing circuit configured to:
detect a discontinuity in the perimeter; and
initiate, in response to a detection, an action from a] response device.

2. The electronic system of claim 1, wherein:
the electronic system is a cryptography security system;
the electronic module is a cryptography module;
the perimeter is a secure perimeter surrounding the cryptography module; and
the sensing circuit is configured to detect an attempted violation of the secure perimeter.

3. The electronic system of claim 1, wherein the action that signals a discontinuity in the perimeter is selected from the group consisting of: deleting encryption keys within the electronic module, sending an email notification, sending a Short Messaging Service (SMS) notification, illuminating an indicator and sounding an audible alarm.

4. The electronic system of claim 1, wherein the sensing circuit is configured to detect a discontinuity in the perimeter by detecting a resistance of the trace circuit that indicates the discontinuity in the perimeter.

5. The electronic system of claim 1, wherein the trace circuit is fabricated as a flexible circuit.

6. The electronic system of claim 1, wherein the response device is selected from the group consisting of: a processor circuit, a service processor, the electronic module and a network-connected device.

7. The electronic system of claim 1, wherein the perimeter of the trace circuit includes a first electrically conductive serpentine trace.

8. The electronic system of claim 7, wherein the trace circuit includes a second electrically conductive serpentine trace electrically insulated from the first electrically conductive serpentine trace by a dielectric layer.

9. The electronic system of claim 1, wherein the dielectric material is capable of reducing power consumption of the electronic system, and thereby capable of increasing and extending the life of a battery used to power the electronic system.

10. A method for designing an electronic system for managed battery life and managed electronic data security for an electronic module, the method comprising:
receiving design requirements for the electronic system;
characterizing dielectric materials that are candidates for use in the electronic system;
choosing, from candidate dielectric materials, a dielectric material in accordance with the design requirements, wherein the choosing includes selecting a dielectric material having:
a characterized electrical leakage that is less than a specified electrical leakage value; and
a characterized electrical leakage that varies less than a specified amount over an operating temperature range;
designing a trace circuit to include a chosen dielectric material;
fabricating the trace circuit in accordance with the trace circuit design; and
integrating the trace circuit into the electronic system by:
surrounding the electronic module with a cover and attaching the trace circuit to an inner surface of the cover to provide a perimeter that encloses the electronic module;
electrically interconnecting the trace circuit to a sensing circuit and choosing, in accordance with the design requirements, a supplemental dielectric material,
wherein the designing of the trace circuit includes the dielectric material and the supplemental dielectric material, and the designing of the trace circuit includes specifying amounts of the dielectric material and of the supplemental dielectric material that result in a leakage of the trace circuit that is less than a leakage threshold value.

11. The method of claim 10, wherein:
the electronic system is a cryptography security system;
the electronic module is a cryptography module;
the perimeter is a secure perimeter surrounding the cryptography module;
the sensing circuit is configured to detect an attempted violation of the secure perimeter; and
the electronic system design requirements include a minimum operational life of a battery configured to power the electronic system.

12. The method of claim 11, wherein the minimum operational life of a battery configured to power the electronic system is specified by a published cryptosecurity specification.

13. The method of claim 10, wherein characterizing candidate dielectric materials includes characterizing electrical leakage properties, including temperature dependent electrical leakage variation, of the candidate dielectric materials.

14. The method of claim 10, wherein the candidate dielectric materials include materials selected from the group consisting of: an adhesive dielectric material and clad dielectric material sheet.

15. A method for operating an electronic system for managed battery life and managed electronic data security for an electronic module, the method comprising:
- applying, with a sensing circuit, a voltage to a trace circuit that is attached to an inner surface of a cover that encloses an electronic module, wherein the trace circuit is configured to provide a perimeter that encloses the electronic module, and the trace circuit includes dielectric material located between electrically conductive layers, the dielectric material having:
  - a characterized electrical leakage that is less than a specified electrical leakage value; and
  - a characterized electrical leakage that varies less than a specified amount over an operating temperature range,
- wherein the trace circuit further includes a supplemental dielectric material, and wherein amounts of the dielectric material and of the supplemental dielectric material are included that result in a leakage of the trace circuit that is less than a leakage threshold value;
- measuring, with the sensing circuit, a sensed voltage on the trace circuit;
- comparing the sensed voltage to a voltage threshold to detect a discontinuity in the perimeter; and
- initiating, with a response device electrically interconnected to the sensing circuit, an action in response to the sensed voltage indicating the discontinuity in the perimeter.

16. The method of claim 15, wherein:
- the electronic system is a cryptography security system;
- the electronic module is a cryptography module;
- the response device is selected from the group consisting of: the electronic module, a processor circuit, a network-connected device and a service processor;
- the perimeter is a secure perimeter surrounding the cryptography module; and
- the sensing circuit is configured to detect an attempted violation of the secure perimeter surrounding the cryptography module.

17. The method of claim 16, wherein the response that signals a discontinuity in the perimeter is selected from the group consisting of: deleting encryption keys within the electronic module, sending an email notification, sending a Short Messaging Service (SMS) notification, illuminating an indicator and sounding an audible alarm.

18. The method of claim 15, wherein the trace circuit is fabricated as a flexible circuit.

* * * * *